United States Patent [19]

Kimura

[11] 4,382,183

[45] May 3, 1983

[54] X-RAY DETECTOR OF SEMICONDUCTOR TYPE

[75] Inventor: Osamu Kimura, Kyoto, Japan

[73] Assignee: Horiba Ltd., Miyanohigashi, Japan

[21] Appl. No.: 223,291

[22] Filed: Jan. 8, 1981

[30] Foreign Application Priority Data

Jan. 22, 1980 [JP] Japan ................................. 55-6647

[51] Int. Cl.³ .................... G01N 23/00; G01T 1/22
[52] U.S. Cl. ................................... 250/310; 250/370;
250/396 R; 378/147
[58] Field of Search ................... 250/310, 370, 396 R,
250/505, 510

[56] References Cited

U.S. PATENT DOCUMENTS 3,471,694 10/1969 Poen .................................. 250/310
3,614,424 10/1971 Openshaw .......................... 250/505

Primary Examiner—Bruce C. Anderson
Attorney, Agent, or Firm—Wenderoth, Lind & Ponack

[57] ABSTRACT

An X-ray detector of semiconductor type in which reflected electrons emitted from a sample are diverted to another direction by the action of a magnetic field provided across a passage for X-rays from a sample to an X-ray detecting element of semiconductor type, and an absorbent for absorbing reflected electrons is arranged ahead of the magnetic field in the path of the diverted reflected electrons, so as to prevent the reflected electrons from being incident on the X-ray detecting element, thereby improving the S/N ratio of the detecting element.

12 Claims, 2 Drawing Figures

X-RAY DETECTOR OF SEMICONDUCTOR TYPE

DESCRIPTION OF THE INVENTION (1) Field of the Invention

The present invention relates to an X-ray detector of semiconductor type in which an X-ray detecting element detects X-rays emitted from a sample to which an electron beam is applied.

(2) Description of the Prior Art

X-rays emitted from a sample to which an electron beam is applied have the wavelengths corresponding to the elements contained in a minute portion of a sample to which an electron beam is applied and consequently the elements contained in that minute portion of the sample can be analysed qualitatively or quantitatively by detecting X-rays emitted from the sample when an electron beam is applied. Thus, an X-ray detector of semiconductor type belonging to this type has been widely used, for example in an electron microscope and the like. However, as to a detector of this type, when an electron beam is applied to a sample, reflected electrons are also emitted from the sample together with X-rays, and these reflected electrons are incident upon the X-ray detecting element of semiconductor type. The incidence of the reflected electrons creates noise leading to the deterioration of the S/N ratio of the detector. Although the incidence of reflected electrons can be avoided by increasing the thickness of a protective window located in front of an X-ray detecting element, an increased window thickness also blocks X-rays containing the information necessary for the desired elemental analysis, and consequently the improvement of the S/N ratio cannot be expected.

SUMMARY OF THE INVENTION

An object of the present invention is to provide an X-ray detector of semiconductor type which can effectively arrest the incidence of reflected electrons leading to the generation of noise without reducing the detection of incident X-rays, to remarkably improve the S/N ratio.

DESCRIPTION OF THE PREFERRED EMBODIMENT

Figure 1:
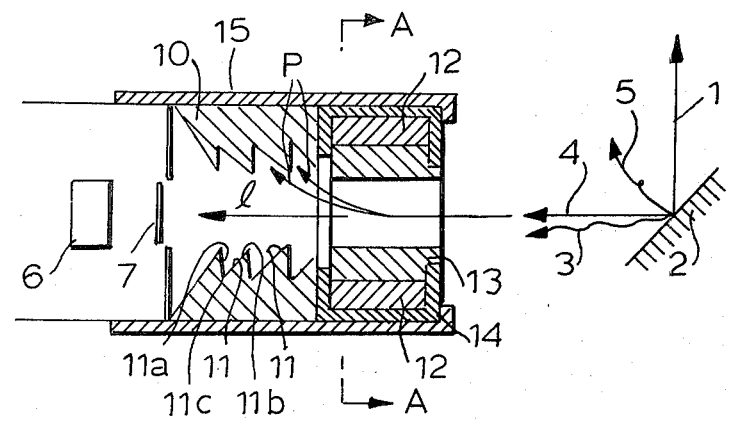
FIG. 1 is a diagrammatic view showing one preferred embodiment of the present invention.
Figure 2:
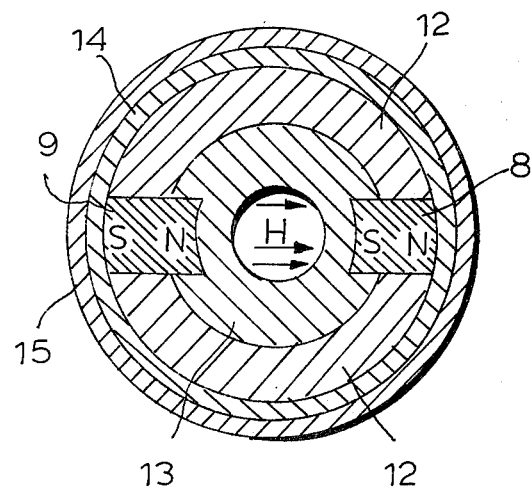
FIG. 2 is a cross-sectional view through FIG. 1 taken along the line of A—A there.

One preferred embodiment of the present invention will be described hereinafter by reference to the drawings. FIG. 1 is a diagrammatic view showing the whole construction of an X-ray detector of semiconductor type and FIG. 2 is a cross-sectional view through FIG. 1 taken along the line A—A thereof. Now referring to these drawings, an electron beam applied to a sample 2 causes X-rays 3, reflected electrons 4 and secondary electrons 5 to be emitted from sample 2. An X-ray detecting element 6 of semiconductor type, for example an X-ray detecting element of Si(Li) type is arranged opposite to sample 2 for detecting X-rays 3. A protective window 7 is located in front of detecting element 6 so as to intercept reflected electrons 4.

A pair of magnets 8 and 9 is oppositely arranged along both sides of a passage 1 through which X-rays pass from sample 2 to detecting element 6, magnets 8, 9 forming a magnetic field H in passage 1 in the direction meeting at right angles with the direction in which X-rays 3 advance. X-rays 3 advance straight without being influenced by magnetic field H so as to be incident upon detecting element 6, while reflected electrons 4 advancing along passage 1 together with X-rays 3, experience a force defined by Frehming's left hand law from magnetic field H because reflected electrons 4 are negatively charged and as a result reflected electrons 4 turn their direction to the direction shown by arrow p in FIG. 1. In order to assure that after being diverted by magnetic field H reflected electrons 4 are not reflected back toward detecting window 7, they can be absorbed by an absorbent which will be described below.

Moreover, when secondary electrons 5 enter said passage 1, they are also turned to another direction like reflected electrons 4 and as a result secondary electrons 5 are deviated from the course toward window 7.

An absorbent 10 for absorbing reflected electrons 4 is arranged between magnets 8, 9 and detecting element 6 ahead in the direction in which reflected electrons 4 advance after they are turned to another direction by the action of magnetic field H, absorbent 10 being made of such materials that do not emit fluorescent X-rays even if electrons or X-rays are applied thereto, or that only fluorescent X-rays of low energy level which have minimal effect on the signal to noise ratio, a material such as for example carbon or boron nitride or the like. According to an optimum preferred embodiment of the present invention, absorbent 10 is provided with a plurality of saw-toothed grooves 11 along passage 1 on the internal surfaces thereof facing passage 1 as shown in FIG. 1, so that fluorescent X-rays emitted by collision of reflected electrons 4 with one surface 11a of groove 11 are absorbed by surface 11b. Even if a part of the fluorescent X-rays is reflected from surface 11b, these X-rays are repeatedly reflected, or absorbed, by the surface 11b and 11a until they reach the lowest portion 11c of groove 11, and as a result the incidence of reflected electrons 4 on detecting element 6 can be avoided. Although fluorescent X-rays emitted by absorbent 10 have little influence upon the S/N ratio of detector 6 because fluorescent X-rays emitted from absorbent 10 have a low energy level, a S/N ratio can be improved further by providing grooves 11. Besides, referring now to the drawings, there are provided surrounding path 1 between absorbent 10 and sample 2, a yoke 12, a protective absorbent 13, a cylindrical magnetic shield 14, and a case 15. Yoke 12 is used for strengthening magnetic field H formed by magnet 8, 9, said protective absorbent 13, covering the inner portions of magnets 8 and 9 and being used for preventing fluorescent X-rays of high energy level from being emitted when electrons and X-rays are directed toward magnet 8, 9, yoke 12, and said magnetic shield 14. Protective absorbent 13 is made of the materials like those of absorbent for absorbing 10 reflected electrons before they reach magnet 8, 9, yoke 12, and magnetic shield 14. Magnetic shield 14 is used for preventing lines of magnetic force formed by magnet 8, 9 from escaping outwardly to influence the incidence of electron beam 4 on sample 2, and magnetic shield 14 is made of materials that have high magnetic permeability, for example permalloy and the like.

EFFECT OF THE INVENTION

As described above, in an X-ray detector of semiconductor type according to the present invention in which X-rays emitted from a sample to which electron beams are applied are detected by an X-ray detecting element of semiconductor type, only X-rays are incident on the detecting element because reflected electrons emitted from the sample are turned to another direction by the action of an off-set magnetic field provided across a passage for X-rays from the sample to the X-ray detecting element and as a result the S/N ratio can be improved and thus the accuracy and the reliability of the detector will be improved remarkably. Also, as shown in the above-described preferred embodiment, an absorbent for absorbing reflected electrons arranged in the direction of advancement of reflected electrons after they are turned to another direction, may absorb off-set reflected electrons and this leads to a still more improvement of the S/N ratio.

In particular, as shown in the above described preferred embodiment of the present invention, an absorbent for absorbing reflected electrons provided with a plurality of saw-toothed grooves therealong can still more improve the S/N ratio because fluorescent X-rays are remarkably reduced as described above.

What is claimed is:

1. An X-ray detector with a semiconductor detecting element, for detecting X-rays emitted from a sample, upon impingement of an electron beam, in a first direction along a path, comprising:
   means for generating a magnetic field perpendicular said first direction across said path so as to divert electrons along said path in directions perpendicular thereto;
   first electron absorber means, located between said magnetic field means and said detector element and outside of said path, for absorbing said electrons diverted by said magnetic field means;
   means, connected to said magnetic field generating means and surrounding said path, for strengthening said magnetic field across said path;
   means, surrounding said magnetic field generating means and said magnetic field strengthening means, for constraining said magnetic field to within said magnetic field strengthening means, thereby protecting said electron beam from magnetic field lines generated by said magnetic field generating means; and
   second electron absorber means, disposed between said path and said magnetic field generating means, for absorbing electrons directed toward, and preventing fluorescent X-rays from being emitted from, said magnetic field generating means, said magnetic field constraining means and said magnetic field strengthening means.

2. An X-ray detector as in claim 1, wherein said magnetic field generating means comprises two opposing magnets positioned on opposite sides of said path between said first electron absorber means and said sample.

3. An X-ray detector as in claim 1 or claim 2, wherein said first electron absorber means comprises a first material which absorbs electrons impinging thereon without emitting high energy fluorescent X-rays in response thereto; said material being of a kind which does not emit high energy fluorescent X-rays in response to X-rays impinging thereon.

4. An X-ray detector as in claim 3, wherein said second electron absorber means comprises a second material which absorbs electrons impinging thereon without emitting high energy fluorescent X-rays in response thereto; said material being of a kind which does not emit high energy fluorescent X-rays in response to X-rays impinging thereon.

5. An X-ray detector as in claim 3, wherein said first material comprises carbon.

6. An X-ray detector as in claim 3, wherein said material comprises boron nitride.

7. An X-ray detector as in claim 2, wherein said magnetic field strengthening means comprises a yoke connecting said first and second magnets, said yoke and said first and second magnets surrounding said first electron absorber means.

8. An X-ray detector as in claim 2, further comprising a casing surrounding said first electron absorber means and said magnetic field constraining means.

9. An X-ray detector as in claim 2, wherein said magnetic field constraining means comprises a material of high magnetic permeability.

10. An X-ray detector as in claim 9 wherein said material of high magnetic permeability comprises permalloy.

11. An X-ray detector as in claim 1, wherein said path consists of a straight path extending from the sample to the semiconductor detecting element.

12. An X-ray detector as in claim 1, wherein said first electron absorber means comprises absorbent material having a surface generally facing said path, said surface having a plurality of saw-tooth shaped grooves formed therein.

* * * * *